(12) United States Patent
West et al.

(10) Patent No.: US 6,894,766 B1
(45) Date of Patent: May 17, 2005

(54) METHOD FOR CONSTRUCTING A PHOTOMASK ASSEMBLY USING AN ENCODED MARK

(75) Inventors: Craig A. West, Austin, TX (US); Glenn Edward Storm, Ridgefield, CT (US); Susan S. MacDonald, Georgetown, TX (US); Joseph S. Gordon, Gardiner, NY (US); James A. Carroll, III, Richardson, TX (US)

(73) Assignee: DuPont Photomasks, Inc., Round Rock, TX (US)

( * ) Notice: Subject to any disclaimer, the term of this patent is extended or adjusted under 35 U.S.C. 154(b) by 71 days.

(21) Appl. No.: 10/106,605

(22) Filed: Mar. 26, 2002

Related U.S. Application Data (60) Provisional application No. 60/279,062, filed on Mar. 27, 2001.

(51) Int. Cl.[7] .............................................. G03B 27/62
(52) U.S. Cl. ..................................................... 355/75
(58) Field of Search .............................. 355/53, 72–76; 430/5, 20, 22

(56) References Cited

U.S. PATENT DOCUMENTS

| 5,283,943 | A  |   | 2/1994  | Aguayo et al. ............... 29/701 |
| 5,513,427 | A  | * | 5/1996  | Yokoyama et al. ........... 29/701 |
| 5,948,572 | A  | * | 9/1999  | Liu et al. ........................ 430/5 |
| 6,473,520 | B2 | * | 10/2002 | Hunatsu ...................... 382/144 |
| 6,573,520 | B1 |   | 6/2003  | Satoh et al. ............. 250/492.3 |

FOREIGN PATENT DOCUMENTS

JP            403083321 A   *   4/1991

* cited by examiner

Primary Examiner—Henry Hung Nguyen
(74) Attorney, Agent, or Firm—Baker Botts L.L.P.

(57) ABSTRACT

A method for constructing a photomask assembly using an encoded mark is disclosed. The method includes comparing a first encoded mark located on a photomask with a second encoded mark located on a pellicle. The first encoded mark includes one or more first symbols and the second encoded mark includes one or more second symbols. The method further includes mounting the pellicle on the photomask if at least one of the symbols of the first encoded mark matches at least one of the symbols of the second encoded mark.

18 Claims, 4 Drawing Sheets

METHOD FOR CONSTRUCTING A PHOTOMASK ASSEMBLY USING AN ENCODED MARK

CROSS REFERENCE TO RELATED APPLICATION

This application claims priority from U.S. Provisional Patent Application Ser. No. 60/279,062 filed Mar. 27, 2001, and entitled "Unique Mask and Pellicle Quality Assurance Encoding Scheme to Manage and Confirm Accurate Material Assembly Requirement."

TECHNICAL FIELD OF THE INVENTION

This invention relates in general to photolithography, and more particularly to a method of constructing a photomask assembly using an encoded mark.

BACKGROUND OF THE INVENTION

Photomasks, commonly referred to as masks or reticles, are used in the manufacture of semiconductor integrated circuits (ICs). Typically, a photomask is made of an opaque patterned layer applied on a transparent substrate. By exposing the photomask to a particular wavelength of light in a photolithographic process, an image is projected through the photomask onto a semiconductor wafer creating an imprint of the patterned layer on the wafer.

Since a photomask is used to project this image and any defect on the surface of the photomask will result in a transferred imperfection onto the wafer, any defect on the surface of the photomask could possibly render the wafer useless. Therefore, manufacturers of semiconductor ICs take great care to protect the quality of photomasks used in the manufacturing process. To further such quality, pellicles have been developed to protect the image plane of the photomask.

A pellicle provides a protective membrane over the photomask to keep contaminants away from the image plane of a patterned layer on a photomask. Generally, pellicles are designed to be highly transmissive to particular wavelengths. The use of a pellicle with an incorrect wavelength may cause the pellicle to degrade, which can reduce the amount of light transmitted through the photomask and affect a pattern projected on a wafer. Therefore, manufacturers take care in matching the correct pellicle with the correct photomask for a particular exposure wavelength. Even if a pellicle and a photomask are correctly assembled, a problem may still exist if a photomask assembly, which includes a photomask and a pellicle, is placed in the wrong lithography tool.

A lithography tool, such as a stepper, scanner, or proximity printer, may use a variety of different wavelengths. Although most photomasks may be used with various photolithographic tools, a pellicle membrane is typically wavelength specific. For example, I-line reticles within a device set are assembled with I-line compatible pellicles. Similarly, deep ultraviolet (DUV) equipment requires DUV compatible pellicles. Although DUV pellicles can be used in I-line applications, the cost of DUV pellicles greatly outweighs the benefit of this generic feature. Conversely, inexpensive I-line membrane pellicles used at DUV wavelengths will rapidly degrade and ultimately corrupt the printed image on a wafer.

Currently, semiconductor manufacturers attempt to manage problems associated with a mixed wavelength photomask manufacturing process by using complex part numbers on each photomask component. A technician must generally read and cross-reference each part number with, for example, a list of part numbers to determine if a pellicle is compatible with a specific manufacturing process. This technique suffers from several opportunities for human error. Any lapse in concentration or error in the part number list may result in the improper combining of photomask assemblies for a manufacturing process, which may cause costly mistakes.

Further, a conventional manufacturing method uses part numbers that are based on a particular photomask component. For example, a part number on a pellicle may use a four-digit number to determine the type of material used to make a pellicle film. This part number must then be cross-referenced to determine which exposure wavelengths are compatible for this type of material. However, a photomask may use a five-digit part number to define which exposure wavelengths are compatible with the photomask. Using this different part numbering system for each photomask component may result in improper combining of photomask assemblies for a manufacturing process, which may further cause costly mistakes.

SUMMARY OF THE INVENTION

In accordance with the teachings of the present invention, the disadvantages and problems associated with constructing and using a photomask assembly in a lithography process have been substantially reduced or eliminated. In a particular embodiment, a method constructing a photomask assembly includes mounting a pellicle on a photomask if at least one of the symbols of a first encoded mark matches at least one of the symbols of a second encoded mark.

In accordance with one embodiment of the present invention, a method for constructing a photomask assembly includes comparing a first encoded mark with a second encoded mark. The first encoded mark may be located on a photomask and includes one or more symbols. The second encoded mark may be located on the pellicle and includes one or more symbols. The pellicle may be mounted on the photomask if at least one of the symbols of the first encoded mark matches at least one of the symbols of the second encoded mark.

In another embodiment of the present invention, a photomask assembly includes a photomask with a first encoded mark and a pellicle with a second encoded mark. The photomask may include a patterned layer formed on a substrate. The substrate may include the first encoded mark that contains one or more symbols. The pellicle may include a frame coupled to the substrate and a thin film attached to the frame. The frame may include a second encoded mark that contains one or more symbols. The photomask assembly further includes at least one of the symbols of the first encoded mark that matches at least one of the symbols of the second encoded mark.

In a further embodiment of the present invention, a pellicle includes a frame, a thin film attached to the frame, and an encoded mark formed on the frame. The encoded mark includes at least one symbol that corresponds to a manufacturing specification.

Important technical advantages of certain embodiments of the present invention include an encoding system that provides the ability to associate a photomask assembly with a particular manufacturing specification by means of an encoded mark. In contrast to conventional part numbers, an encoded mark may be associated with a manufacturing specification. By placing the encoded mark on a photomask component, the component may be associated with the manufacturing specification. For example, if a pellicle is compatible for a particular exposure wavelength, an encoded mark representing the particular exposure wavelength may be placed on the pellicle. The pellicle may then be associated for use in any manufacturing process that uses the particular exposure wavelength. Further, the pellicle may be combined with other photomask components having the same encoded mark as needed for different manufacturing processes.

Another important technical advantage of certain embodiments of the present invention includes an encoding system that reduces errors during construction of a photomask assembly. A potential error exists during construction of a photomask assembly by improperly orientating the pellicle on the photomask. To aid in construction of a photomask assembly, encoding marks may be used to identify the proper alignment for the pellicle to the photomask. Being able to match and align encoding marks on photomask components permits the correct construction of a photomask assembly.

A further important technical advantage of certain embodiments of the present invention includes an encoding system that reduces manufacturing errors based on an incompatible photomask assembly. Incorporating the encoding marks on photomask components allows for constant monitoring of the compatibility of components. As part of this monitoring process, a photomask assembly may be inspected to determine that the assembly has been constructed according to the correct specifications for a particular semiconductor process. A photomask assembly used in the wrong semiconductor process may cause damage to a semiconductor IC chip being created from the photomask assembly.

All, some or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and their advantages are best understood by reference to FIGS. 1 through 7, where like numbers are used to indicate like and corresponding parts.

Figure 1:
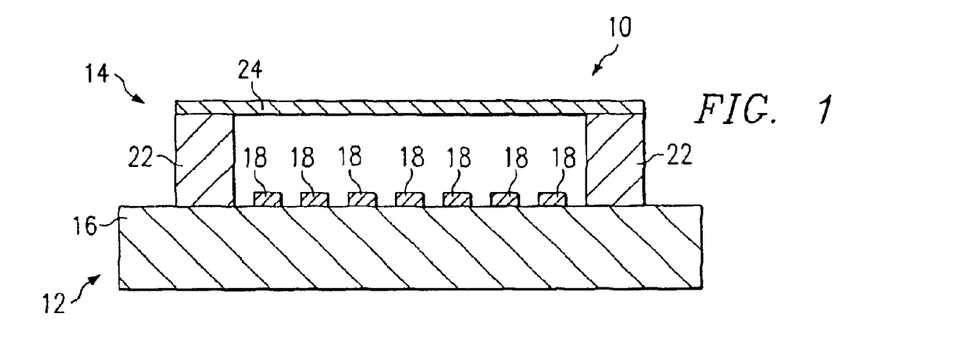
FIG. 1 illustrates a cross-sectional view of a photomask assembly according to the teachings of the present invention.

FIG. 1 illustrates a cross-sectional view of photomask assembly 10. In the illustrated embodiment, photomask assembly 10 includes photomask 12 coupled to pellicle 14. Substrate 16 and patterned layer 18 form photomask 12, otherwise known as a mask or reticle. Photomask 12 may have a variety of sizes and shapes, including but not limited to round, rectangular, or square. Photomask 12 may also be any variety of photomask types, including, but not limited to, a one-time master, a five-inch reticle, a six-inch reticle or a nine-inch reticle. Photomask 12 may further be a binary mask, a phase shift mask, or any other type of mask suitable for use in a lithography system.

Substrate 16 may be a transparent material such as quartz, synthetic quartz, fused silica, magnesium fluoride ($MgF_2$), calcium fluoride ($CaF_2$), or any other suitable material that transmits approximately seventy-five percent (75%) of incident light having a wavelength between approximately 10 nanometers (nm) and approximately 450 nm. In an alternative embodiment, substrate 16 may be a reflective material such as silicon or any other suitable material that produces a reflectance at the exposure wavelength of greater than approximately fifty percent (50%). Patterned layer 18 may be a metal material such as chrome, chromium nitride, a metallic oxy-carbo-nitride where the metal is selected from the group consisting of chromium, cobalt iron, zinc, molybdenum, niobium, tantalum, titanium, tungsten, aluminum, magnesium and silicon, and any other suitable material that absorbs light with wavelengths between approximately 10 nm and approximately 450 nm. In an alternative embodiment, patterned layer 18 may be a partially transmissive material, such as molybdenum silicide (MoSi), which has a transmissivity of approximately one percent (1%) to approximately thirty percent (30%).

Pellicle 14 typically includes pellicle frame 22 and pellicle film 24. Pellicle film 24 may be a thin film membrane formed of a material such as nitrocellulose, cellulose acetate, an amorphous fluoropolymer such as Teflon® AF manufactured by E. I. du Pont de Nemours and Company or Cytop® manufactured by Asahi Glass, or another suitable film for use in a deep ultraviolet (DUV), vacuum ultraviolet (VUV) or extreme ultraviolet (EUV) application. Pellicle film 24 may be prepared by a conventional technique such as spin casting. Pellicle frame 22 is typically formed of anodized aluminum, although it could alternatively be formed of stainless steel, plastic or any other suitable materials. In operation, pellicle film 24 is designed to allow a large percentage of the radiant energy to pass through it in order to produce a high quality image from patterned layer 18.

Because there are a large variety of photomask components, a potential exists to incorrectly match photomask components with a manufacturing process or incorrectly assemble the components. To aid in the construction of photomask assembly 10, an encoding mark may be placed on each photomask component. The encoded marks allow a technician to readily determine correctly matching parts according to a manufacturing specification. For example, a manufacturing specification indicating a phase shifting application may be determined by looking for a particular encoded mark which matches the phase shifting application. Ensuring that both photomask components include this particular encoded mark may allow for correct construction of photomask assembly 10.

Figure 2A:
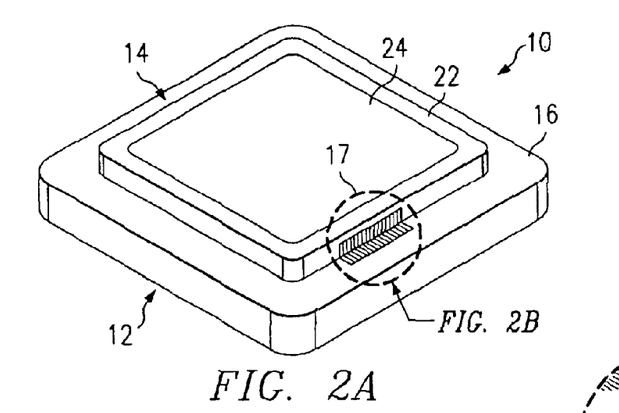
FIG. 2A illustrates a perspective view of a photomask assembly that includes an encoded mark according to the teachings of the present invention.

FIG. 2A illustrates a perspective view of photomask assembly 10 that includes an encoded mark. The encoded mark placed on photomask assembly 10 may provide acceptable manufacturing specifications for photomask assembly 10. One acceptable manufacturing specification that may be represented by the encoded mark is a range of exposure wavelengths (e.g., 10 nm to 450 nm) suitable for use a lithographic process. Other manufacturing specifications may include: a type of photomask such as a 5-inch reticle; a photomask material such as quartz; a pellicle material such as a fluoropolymer; an orientation of the photomask with respect to the pellicle or the lithographic tool; a phase shifting technique such as a strong shift or half shift; an optical enhancement technique such a serif to correct rounded corners; a reflection technique; or any combination thereof.

Because a photomask component may be associated with several different manufacturing specifications, an encoded mark may include one or more symbols. Each symbol may be used to represent a different manufacturing specification. Unlike a specific part number, the symbols are not component specific. In contrast, each symbol is associated with a manufacturing specification and thus is not unique to each photomask component.

A symbol may include a number, a letter, a triangle, a square, a rectangle, a circle, an oval, a polygon, a picture, a graphic, a color, a bar code or any other mark suitable for associating a photomask component with a manufacturing specification. For example, a pellicle may utilize an encoded mark to represent deep ultraviolet (DUV) exposure wavelengths that would be placed on both the pellicle and the photomask. Matching the pellicle to the photomask permits the construction of photomask assembly 10 suitable for DUV exposure wavelengths.

Figure 2B:
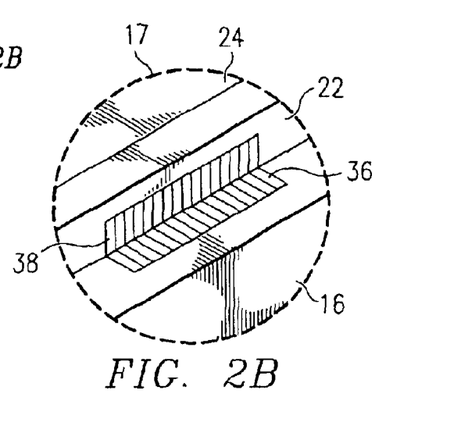
FIG. 2B illustrates a schematic drawing with portions broken away of a perspective view of a photomask mask assembly that includes one embodiment of an encoded mark according to the teachings of the present invention.

FIG. 2B illustrates a schematic drawing with portions broken away of a perspective view of a photomask assembly that includes two encoded marks incorporating the teachings of the present invention. Photomask assembly 10 may include photomask 12 having photomask encoded mark 36 placed on substrate 16 and pellicle 14 having pellicle encoded mark 38 placed on pellicle frame 22. Both photomask encoded mark 36 and pellicle encoded mark 38 may correspond with a manufacturing specification, such as a particular exposure wavelength in a lithographic tool, that is compatible with each component of photomask assembly 10. In one particular embodiment, photomask encoded mark 36 and pellicle encoded mark 38 are also used to align and orient pellicle 14 to couple with photomask 12. By comparing the two aligned marks for similarities, a determination may be made whether pellicle 14 is compatible with photomask 12 and a specific manufacturing process. In other embodiments, the encoded marks on photomask 12 and pellicle 14 may only require one matching symbol in order to be compatible with each other and a particular manufacturing specification.

The encoded marks illustrated in FIGS. 2A and 2B may be represented by a bar code configuration or any other configuration suitable for comparison. The configuration for the encoded mark provides visual keys that may define multiple manufacturing specifications corresponding to a manufacturing process. For example, an encoded mark may include symbols representing different exposure wavelengths, such as 365 nanometers (nm), 248 nm, 193 nm and 157 nm, of the different light sources used to expose pattern layer 18 of photomask assembly 10 onto a semiconductor wafer. Another example may include a pellicle material specification, such as the material needed for pellicle film 24 to be compatible with the different exposure wavelengths.

Figure 3:
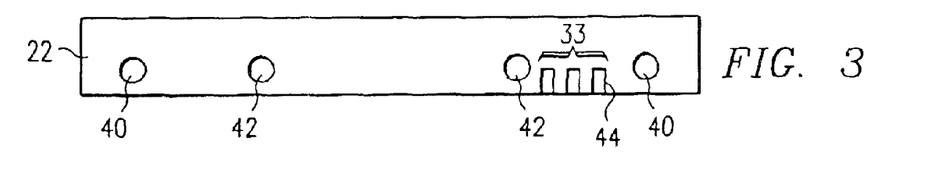
FIG. 3 illustrates one embodiment of a location for the encoded mark on a pellicle frame according to the teachings of the present invention.

FIG. 3 illustrates one embodiment of a location for encoded mark 33 on pellicle frame 22. In certain embodiments, symbol 44 may be placed on pellicle frame 22 by etching or marking between the demount holes 40 and 42 on pellicle frame 22 to ensure consistent alignment of the encoded mark on each pellicle 14. As illustrated, the position of symbol 44 may be fixed between five-inch type demount hole 40 and six-inch type demount hole 42 for pellicle 14. Symbol 44 and the location of symbol 44 on pellicle frame 22 may represent an exposure wavelength acceptable for use with pellicle 14. By moving symbol 44 to a new location on pellicle 14, another exposure wavelength or a new parameter may be defined. This new parameter could represent any of the above listed parameters including exposure wavelength, type of pellicle film 24 compatible with pellicle 14, material specification for photomask 12, or any other specification used in the manufacturing of semiconductor ICs.

Figure 4:
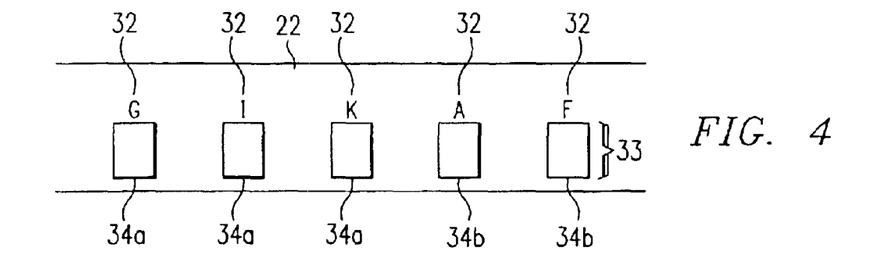
FIG. 4 illustrates one embodiment of an encoded mark placed on a pellicle frame according to the teachings of the present invention.

FIG. 4 illustrates one embodiment of encoded mark 33 placed on pellicle frame 22. Encoded mark 33 may include label 32, filled box 34a and unfilled box 34b. Label 32 may be located adjacent to filled box 34a and unfilled box 34b to represent acceptable exposure wavelengths, which may be used in combination with pellicle 14. While label 32 is shown in conjunction with filled box 34a and unfilled box 34b, encoded mark 33 may be either a label or a box used separately to represent an acceptable exposure wavelength. For example, filled box 34a may represent an acceptable exposure wavelength for pellicle 14 and unfilled box 34b may represent an unacceptable exposure wavelength.

Further, label 32 may refer to the different exposure wavelengths associated with a photolithographic process. The letter "G" may be used to identify exposure wavelengths associated with mercury G-line equipment that has an exposure wavelength of approximately 436 nm. Similarly, the letter "I" may represent mercury I-line equipment that has an exposure wavelength of approximately 365 nm. The letters "K", "A", and "F" may correspond to krypton-fluoride (248 nm), argon-fluoride (193 nm) and fluoride ion (157 nm) excimer lasers respectively, or any equipment utilizing wavelengths between approximately 150 nm and approximately 300 nm. By placing encoded mark 33 on pellicle 14, pellicle 14 may be associated with a particular set of exposure wavelengths for use in a specific lithographic process. Even after photomask 12 is coupled to pellicle 14 to form photomask assembly 10, encoded mark 33 may further be used to associate photomask assembly 10 with a manufacturing process, such as an exposure wavelength.

The encoding system described above may be applicable for constructing photomask assembly 10 regardless of a specific photolithographic process requirement. In certain embodiments, an encoding system may provide explicit designation on pellicle frame 22 for certain types of pellicle films required to construct photomask assembly 10. Similarly, the encoding system may also provide guidance in the selection of a material for pellicle film 24 needed in a semiconductor patterning process during construction of a photomask assembly. In addition, the encoding system may confirm an appropriate match of photomask assembly 10 for use with a particular manufacturing process.

Additionally, a manufacturing process may include arranging photomask assembly 10 for use in a specific tool set to create a particular semiconductor IC. In one embodiment, an orientation position for photomask assembly 10 is defined by an encoded mark and used for arranging photomask assembly 10 in a tool set. Thus, the position of photomask assembly 10 may be determined by arranging photomask assembly 10 according to the encoded mark for proper placement within the tool. In another embodiment, photomask 12 and pellicle 14 include encoded mark 33 to define an orientation position for aligning pellicle 14 to photomask 12. The alignment position may be required to correctly place pellicle 14 on photomask 12. For example, the use of polarized light filtration may require a specific orientation of pellicle film 24 to patterned layer 18.

In a further embodiment, encoded mark 33 may be able to determine a proper sequence of photomask assembly 10 in a tool set. Encoded mark 33 may define a layering sequence for building the IC design on the semiconductor wafer. Having a photomask assembly placed in the wrong order may corrupt the circuit paths causing a faulty IC chip.

In addition to providing a sequence, the encoding system may allow technicians to test photomask components according to the encoded mark placed on the component. In one embodiment, an encoded mark may be placed on each component of photomask assembly 10 to provide manufacturing specifications for testing the component. Because each manufacturing specification may require a different testing procedure, encoded mark 33 may prevent damage to photomask assembly 10 by ensuring the correct test is performed. For example, a test on the transmissive quality of a pellicle 14 may be specified for a deep ultraviolet (DUV) wavelength. By placing an encoded mark on pellicle 14, pellicle 14 can be tested for transmissive qualities according to DUV wavelengths. If pellicle 14 was tested at different exposure wavelengths, pellicle 14 may be damaged, which may further damage any IC chips created with pellicle 14.

Figure 5A:
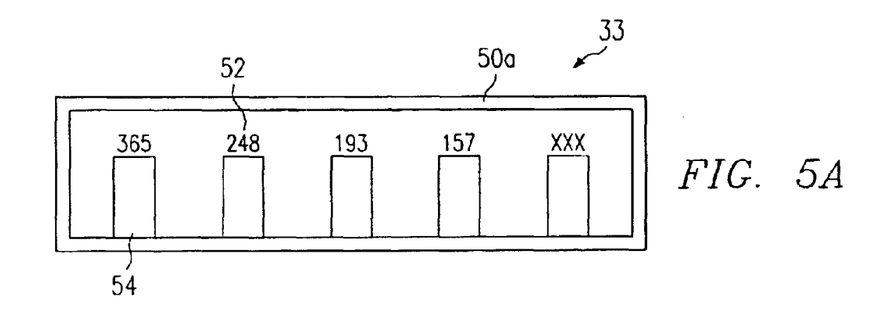
FIGS. 5A through 5C illustrate examples of a frame box with respective encoded marks having several symbols, which represent different photolithographic processes, according to the teachings of the present invention.
Figure 5B:
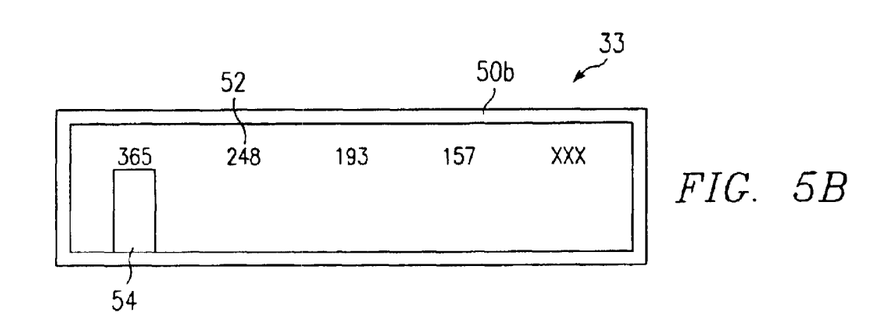
Figure 5C:
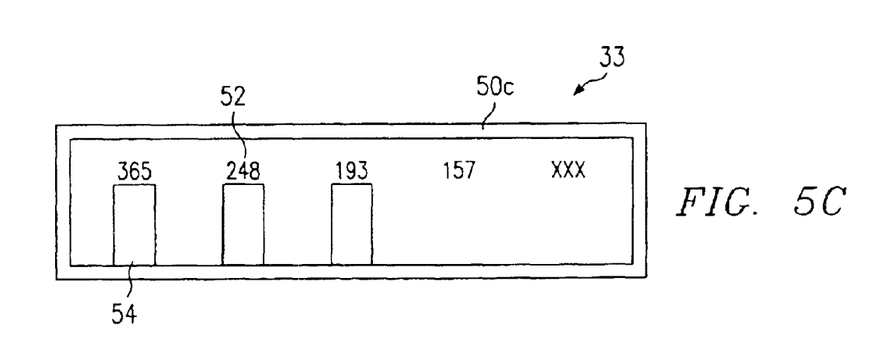

FIGS. 5A through 5C illustrate frame boxes 50a, 50b, and 50c that includes an encoded mark having several symbols which represent different photolithographic processes. In certain embodiments, frame box 50a, 50b, and 50c may include symbols such as number code 52 and bar 54 to represent acceptable manufacturing parameters, such as exposure wavelengths for a semiconductor process. Although both symbols, number code 52 and bar 54, are used to create encoded mark 33, either symbol may be used alone or with another symbol to create encoded mark 33. Bar 54 may be located within frame boxes 50a, 50b, and 50c and number code 52 may be placed adjacent to bar 54. Number code 52 may be used to associate the encoded mark "365" to a 365 nm exposure wavelength for the semiconductor process. Additionally, number code 52 may include codes such as "248", "193", and "157" which may represent other exposure wavelengths used in the semiconductor process. A symbol, shown as "XXX" within frame box 50a, 50b, and 50c depicting number code 52, may represent a reserved space or undefined parameter for a future exposure wavelength parameter.

Referring to FIG. 5A, number code 52 and bar 54 may be used to associate a particular photomask component with exposure wavelengths ranging from 365 nm to 157 nm including an undefined exposure wavelength designated "XXX." Although number code 52 and bar 54 are both included in frame box 50a, either may be used separately to associate the component with a particular exposure wavelength. In one particular embodiment, frame box 50a utilizes both number code 52 and bar 54 to associate a photomask component with exposure wavelengths. Referring to FIG. 5B, frame box 50b includes several instances of number code 52 used to associate the photomask component with several exposure wavelengths. By placing additional symbols, such as bar 54, near number code 52, encoded mark 33 may be associated with only those exposure wavelengths including both bar 54 and number code 52. In this illustration, bar 54 is set adjacent to number code 52 designated "365". Thus, a photomask component including this encoded mark may be deemed to be compatible with a 365 nm exposure wavelength.

Further, frame box 50c may include symbols, such as number code 52 and bar 54, which may associate several exposure wavelengths as being compatible with a photomask component. Referring to FIG. 5C, bar 54 set adjacent to number code 62 shown at "365," "248," and "193" may represent acceptable exposure wavelengths of 365 nm, 248 nm and 193 nm for encoded mark 33. However, if a symbol is missing or left unfilled, the missing symbol may represent an incompatible manufacturing specification. For example, the missing symbol, bar 54 set near number code 62 shown at "157", may represent an incompatible exposure wavelength for a 157 nm process.

Combining photomask components including encoded mark 33 using symbols representing exposure wavelengths may aid in coupling photomask components together with compatible wavelengths. For example, a first photomask component with a first encoded mark such as in frame box 50b may be combined with a second photomask component having a second encoded mark such as in frame box 50c. Comparing the two encoded marks results in only one common symbol (e.g., bar 54 with the associated number code 52 "365") present in both encoded marks. Thus, after coupling these components, the new component would be acceptable for only one exposure wavelength, namely the 365 nm wavelength.

Figure 6:
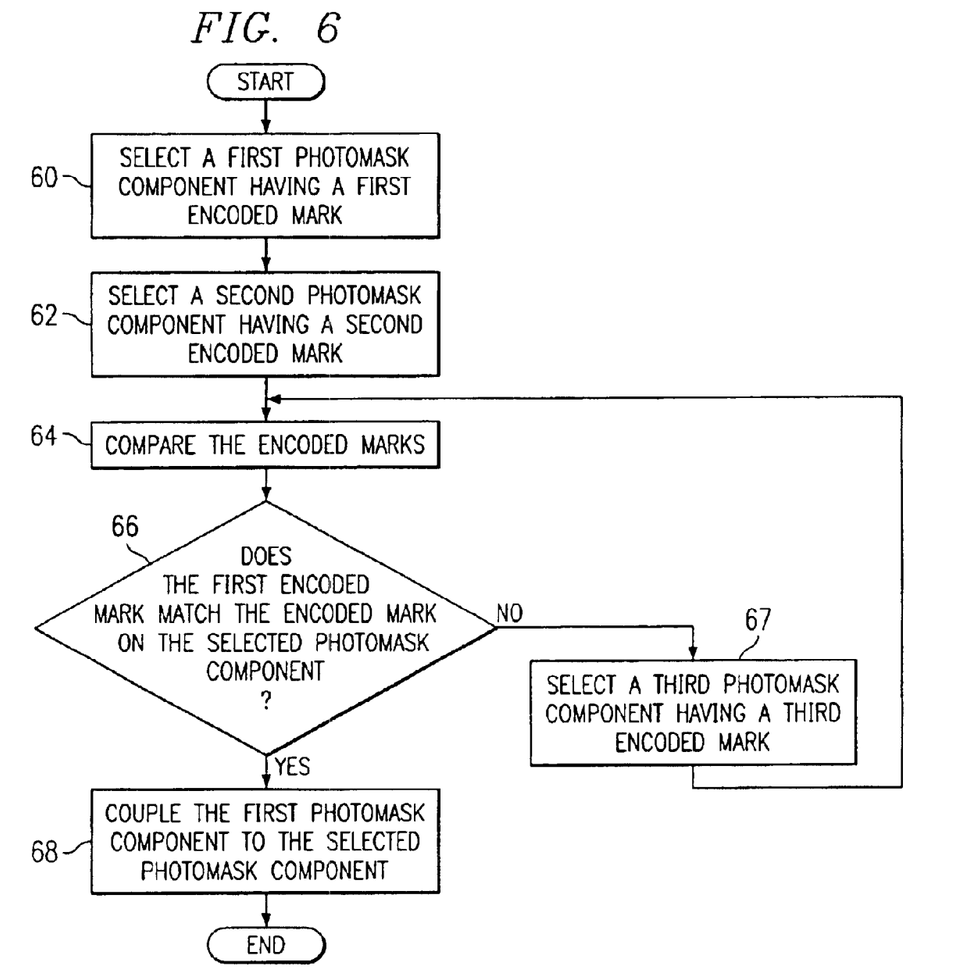
FIG. 6 illustrates a flow diagram for a method of constructing a photomask assembly according to the teachings of the present invention.

FIG. 6 illustrates a flow diagram for a method of constructing photomask assembly 10 using photomask components that include an encoded mark. For example, the method may include comparing encoded mark 33 on photomask 12 with encoded mark 33 on pellicle 14 until a match is found. A first photomask component, such as photomask 12, having a first encoded mark including one or more symbols is selected at step 60. The encoded mark may be selected from a plurality of encoded marks that correspond to a manufacturing parameter. In one embodiment, the first encoded mark is selected based on a particular range of exposure wavelengths in a lithographic process.

At step 62, a second photomask component, such as pellicle 14, having a second encoded mark including one or more symbols may be selected for use with the first photomask component. The second encoded mark may associate the second photomask component with a particular exposure wavelength or group of compatible exposure wavelengths. At step 64, the symbols of the first encoded mark may be compared to the symbols of the second encoded mark. At step 66, a determination is made as to the compatibility of the first photomask component with the second photomask component. If any of the symbols on the first encoded mark match any of the symbols of the second encoded mark, the photomask components may be deemed compatible for all matching symbols. For example, if there is only one common symbol between the two encoded marks, then that common symbol is the compatible manufacturing parameter acceptable for both components. Further, if some of the symbols match, then the components are compatible for all matching symbols. However, if no one symbol matches, then the components are not compatible and a new component must be selected for comparison.

If all of the symbols of the encoded marks do not match, then a third photomask component having a third encoded mark including one or more symbols may be selected at step 67. The symbols on the third encoded mark on the third photomask component may be compared to the symbols on the first encoded mark for compatibility, at step 66.

If there is at least one matching symbol for the photomask components, the compatible photomask components are coupled together to form photomask assembly 10, at step 68. For example, if the encoded mark on photomask 12 includes a symbol for a DUV lithographic process and the encoded mark on pellicle 14 includes the same symbol, photomask 12 and pellicle 14 may be coupled together to form photomask assembly 10. Because the common symbol is for the DUV lithographic process, photomask assembly 10 would be compatible for a DUV process but possible not any other process. Although a technician typically reads the symbols on the encoded marks, the symbols may further be machine readable to automate the assembly process.

Figure 7:
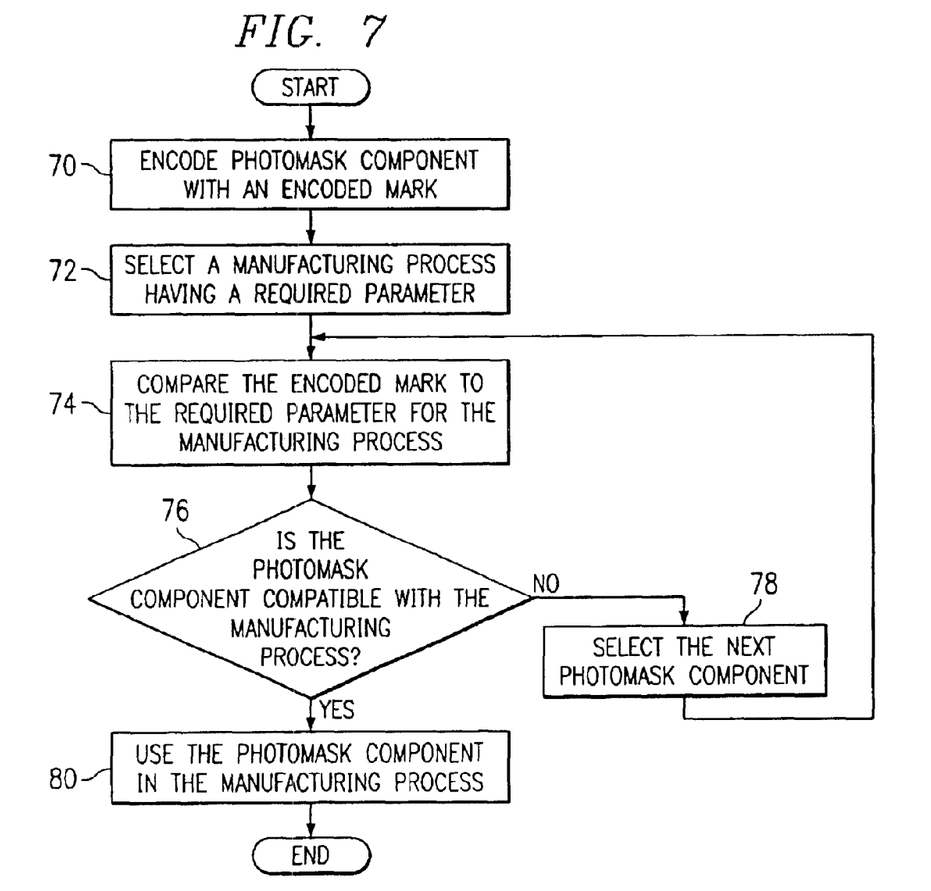
FIG. 7 illustrates a flow diagram for a method of using a photomask assembly with an encoded mark according to the teachings of the present invention.

FIG. 7 illustrates a flow diagram for a method of using a photomask assembly with an encoded mark. Generally, a photomask component is selected for a particular manufacturing process based upon its compatibility with a manufacturing parameter, such as an exposure wavelength. By placing an encoded mark on the photomask component that corresponds to the manufacturing parameter, the compatibility of the photomask component with the manufacturing process can be readily assessed. If the photomask component is not compatible, then other photomask components may be compared for compatibility until a suitable component is found.

A photomask component is encoded with an encoded mark that corresponds with a manufacturing process parameter at step 70. This step can be performed by using several techniques including, but not limited to, etching, labeling, writing, or any other suitable means of placing the encoded mark on the photomask component. The encoded mark may correspond to several different manufacturing parameters for a manufacturing process including material specification for pellicles and photomasks, a range of exposure wavelengths, a range of sizes, different shapes or any other suitable photomask component characteristics. At step 72, a manufacturing process is selected that includes a manufacturing parameter. The manufacturing process may include coupling photomask 12 to pellicle 14, associating photomask assembly 10 with a lithographic tool, or any other procedure or process used to manufacture semiconductor IC devices. In one embodiment, the manufacturing parameter is the 157 nm exposure wavelength used in a lithographic process. In another embodiment, the manufacturing parameter is a pellicle material for pellicle film 24, such as an amorphous fluoropolymer.

At step 74, the encoded mark on the photomask component is compared to the manufacturing parameter from the manufacturing process. In one embodiment, the encoded mark represents a 157 nm exposure wavelength which is compared to the manufacturing parameter for the manufacturing process. If the encoded mark does not match the manufacturing parameter at step 76, then the photomask component is not is not compatible with the manufacturing process. Because the photomask component is not compatible with the manufacturing process, the component should not be used with the selected process. For example, if an encoded mark representing a 157 nm exposure wavelength is compared to a manufacturing parameter for a 248 nm exposure wavelength manufacturing process, the encoded mark would not match the process and the photomask component would be rejected.

If the photomask component is rejected, a second photomask component having an encoded mark is selected at step 78. Returning to step 74, the encoded mark on the second photomask component is then compared to the manufacturing parameter of the manufacturing process. If the encoded mark on the photomask component matches the manufacturing parameter for the process, the photomask component is deemed compatible for the process, at step 76. Being determined to be compatible, the photomask component is accepted and used in the manufacturing process at step 78.

Although the present invention has been described with respect to a specific preferred embodiment thereof, various changes and modifications may be suggested to one skilled in the art and it is intended that the present invention encompass such changes and modifications that fall within the scope of the appended claims.

What is claimed is:

1. A method for constructing a photomask assembly, comprising:
   providing a photomask including a first encoded mark formed thereon, the first encoded mark including one or more symbols;
   providing a pellicle including:
      a frame having at least one side, a top and a bottom, the side including a second encoded mark formed thereon, the second encoded mark including one or more symbols; and
      a film coupled to the top of the frame;
   visually comparing the first encoded mark located on the photomask with the second encoded mark located on the side of the frame associated with the pellicle to determine whether the one or more symbols of the first encoded mark match the symbols of the second encoded mark; and
   mounting the bottom of the frame associated with the pellicle on the photomask to form a photomask assembly if at least one of the symbols of the first encoded mark matches at least one of the symbols of the second encoded mark based on the visual comparison.

2. The method of claim 1, further comprising aligning the first encoded mark proximate the second encoded mark during mounting.

3. The method of claim 1, further comprising selecting the photomask assembly for use in a manufacturing process if at least one of the symbols in the first encoded mark and the second encoded mark matches a symbol associated with the manufacturing process.

4. The method of claim 1, further comprising selecting a manufacturing process for the photomask assembly based on the matching symbols in the first and second encoded marks.

5. The method of claim 1, further comprising:
   selecting a second pellicle if none of the symbols of the first encoded mark matches any symbols of the second encoded mark, the second pellicle including:
      a frame having at least one side, a top and a bottom, the side having a third encoded mark including one or more symbols formed thereon; and a film coupled to the top of the frame; and mounting the bottom of the frame associated with the second pellicle on the photomask if at least one of the symbols of the first encoded mark matches at least one of the symbols of the third encoded mark.

6. The method of claim 1, further comprising the symbols of the first and second encoded marks associated with a range of exposure wavelengths suitable for a lithographic process, the range including exposure wavelengths between 10 nanometers and 450 nanometers.

7. The method of claim 1, further comprising:

identifying a first location for the first encoded mark on the photomask;

identifying a second location for the second encoded mark on the frame, the first and second locations allowing simultaneous viewing of the first and second encoded marks when the pellicle is mounted on the photomask.

8. The method of claim 1, further comprising the first and second encoded marks corresponding to a manufacturing specification.

9. The method of claim 8, further comprising selecting the manufacturing specification from a group consisting of a photomask type, a photomask material, a pellicle material, a photomask design, an orientation of the photomask, a phase shifting technique, an optical enhancement technique, and a reflection technique.

10. A photomask assembly, comprising:

a photomask including a patterned layer formed on a substrate, the substrate including a first encoded mark having one or more symbols; and a pellicle including:

a frame having at least one side, a top and a bottom, the bottom of the frame coupled to the substrate and the side of the frame including a second encoded mark having one or more symbols formed thereon; and a thin film attached to the top of the frame;

wherein at least one of the symbols of the first encoded mark matches at least one of the symbols of the second encoded mark such that the at least one of the symbols of the first encoded mark are visually matched with the at least one of the symbols of the second encoded mark.

11. The photomask assembly of claim 10 further comprising selecting the symbols of the first and second encoded marks from a group consisting of a number, a letter, a triangle, a square, a rectangle, a circle, an oval, a polygon, a picture, a graphic, a color, and a bar code.

12. The photomask assembly of claim 10, further comprising the first and second encoded marks corresponding to a manufacturing specification.

13. The photomask assembly of claim 12, wherein the manufacturing specification comprises an exposure wavelength suitable for use in a lithographic process, the exposure wavelength located in a range between 10 nanometers and 450 nanometers.

14. The photomask assembly of claim 12, wherein the manufacturing specification is selected from a group consisting of a photomask type, a photomask material, a pellicle material, a photomask design, an orientation of the photomask, a phase shifting technique, an optical enhancement technique, and a reflection technique.

15. The photomask assembly of claim 10, wherein the symbols on the first encoded mark substantially match the symbols on the second encoded mark.

16. The photomask assembly of claim 10, further comprising the first encoded mark on the photomask located proximate the second encoded mark on the pellicle.

17. The photomask assembly of claim 10, wherein at least one of the symbols in the second encoded mark comprises a number representing at least one exposure wavelength compatible with the thin film.

18. The photomask assembly of claim 10, wherein at least one of the symbols in the second encoded mark comprises a letter representing at least one exposure wavelength compatible with the thin film.

\* \* \* \* \*